(12) United States Patent
Chiang et al.

(10) Patent No.: US 7,759,769 B2
(45) Date of Patent: Jul. 20, 2010

(54) SEMICONDUCTOR STRUCTURE OF A HIGH SIDE DRIVER

(75) Inventors: Chiu-Chih Chiang, Hsinchu (TW); Chih-Feng Huang, Jhubei (TW)

(73) Assignee: System General Corp., Taipei (TW)

( * ) Notice: Subject to any disclaimer, the term of this patent is extended or adjusted under 35 U.S.C. 154(b) by 174 days.

(21) Appl. No.: 11/489,558

(22) Filed: Jul. 20, 2006

(65) Prior Publication Data
US 2008/0017926 A1    Jan. 24, 2008

(51) Int. Cl.
*H01L 29/06*    (2006.01)
(52) U.S. Cl. .................. 257/532; 257/654; 257/653; 257/487; 257/496; 257/E27.034
(58) Field of Classification Search .......... 257/355, 257/532, 487, 496, 653, 654, E27.034
See application file for complete search history.

(56) References Cited

U.S. PATENT DOCUMENTS

| | | | |
|---|---|---|---|
| 4,907,058 A * | 3/1990 | Sakai | .............. 257/371 |
| 5,258,636 A | 11/1993 | Rumennik et al. | |
| 5,536,672 A * | 7/1996 | Miller et al. | .............. 438/3 |
| 5,640,034 A | 6/1997 | Malhi | |
| 5,640,037 A | 6/1997 | Blanchard | |
| 5,736,774 A | 4/1998 | Fujihira | |
| 5,801,418 A | 9/1998 | Ranjan | |
| 6,124,628 A | 9/2000 | Fujihira et al. | |
| 6,150,698 A | 11/2000 | Ohtsuka et al. | |
| 6,323,539 B1 | 11/2001 | Fujihira et al. | |

OTHER PUBLICATIONS

S.L. Kim, et al. "Realization of Robust 600V High Side Gate Drive IC with a New Isolated Self-Shielding Structure", Proceedings of the 17th International Symposium on Power Semiconductor Devices & IC's, May 26, 2005, pp. 1-2.

* cited by examiner

*Primary Examiner*—Kiesha R Bryant
*Assistant Examiner*—Tucker Wright
(74) *Attorney, Agent, or Firm*—Bacon & Thomas, PLLC

(57) ABSTRACT

A semiconductor structure of a high side driver includes an ion-doped junction. The ion-doped junction includes a substrate and a deep well. The deep well is formed in the substrate and has a first concave structure. The ion-doped junction includes a semiconductor region connected to the first concave structure of the deep well and having substantially the same ion-doping concentration as the substrate.

10 Claims, 8 Drawing Sheets

US 7,759,769 B2

SEMICONDUCTOR STRUCTURE OF A HIGH SIDE DRIVER

BACKGROUND OF THE INVENTION

1. Field of the Invention

The invention relates in general to a semiconductor structure, and more particularly to a semiconductor structure of a high side driver and method for manufacturing the same.

2. Description of the Related Art

With respect to a high side driver, basically, an over-large conductive material covered on the HV junction will reduce the breakdown voltage of the HV junction. Especially, as shown in FIG. 1A, when a conductive capacitor structure 113 of a concave shape is directly disposed on the deep N well (NWD) 111 of the HV junction 101, the breakdown voltage of the P-well (PW) region S of the HV junction 101 near the concave (or corner) region will be largely reduced.

Referring to FIG. 1B, a partial cross-sectional diagram of a semiconductor structure of a high side driver in a conventional power supply IC is shown. The semiconductor structure of a high side driver includes a high voltage (HV) junction 110 formed in a P-substrate 100 and a high voltage (HV) capacitor structure 120 formed on the P-substrate 100. The HV junction 110 includes a deep N well (NWD) 112 and a number of P-wells (PW) 114. The HV capacitor structure 120 includes a first metal layer 122 and two separated second metal layers 124 and 126. The second metal layer 124 is connected to a low voltage, such as 0V, and the second metal layer 126 is connected to a high voltage +V, such as 500V. A heavy ion-doped N+ region 116 is formed between the P wells 114 for connecting to the second metal layer 126 via a bonding metal 130.

In order to prevent the breakdown voltage of the HV junction being reduced by conductors (metals) in the HV capacitor structure, the HV capacitor structure 120 is disposed in a region of the P-substrate 100 separated from that region forming the HV junction 110 and is connected to the HV junction 110 via the bonding metal 130. However, the conventional semiconductor structure of a high side driver has the following disadvantages:

1. It needs more chip space to dispose the HV junction 110 and HV capacitor structure 120 in separated regions of the P-substrate 100.

2. It needs an extra bonding metal 130 for connecting the HV junction 110 and HV capacitor structure 120, and thus more cost for manufacturing the high side driver.

SUMMARY OF THE INVENTION

It is therefore an object of the invention to provide a semiconductor structure of a high side driver, which integrates a HV junction with a concave-shaped capacitor structure, and method for manufacturing the same. The breakdown voltage of the HV junction near the concave region of the capacitor structure can be increased by forming a semiconductor region having substantially the same ion-doped concentration as the substrate in the substrate near the concave region. Therefore, the chip area and cost for manufacturing the high side driver can be reduced.

The invention achieves the above-identified object by providing a semiconductor structure of a high side driver including an ion-doped junction. The ion-doped junction includes a substrate and a deep well. The deep well is formed in the substrate and has a first concave structure. The ion-doped junction includes a semiconductor region connected to the first concave structure of the deep well and having substantially the same ion-doping concentration as the substrate.

The invention achieves the above-identified object by providing a method for manufacturing a semiconductor structure of a high side driver. The method includes forming a substrate; forming a deep well having a first concave structure in the substrate; and forming a semiconductor region in the substrate, wherein the semiconductor region is connected to the first concave structure of the deep well and has substantially the same ion-doping concentration as the substrate.

Other objects, features, and advantages of the invention will become apparent from the following detailed description of the preferred but non-limited embodiments. The following description is made with reference to the accompanying drawings.

DETAILED DESCRIPTION OF THE INVENTION

Figure 1A:
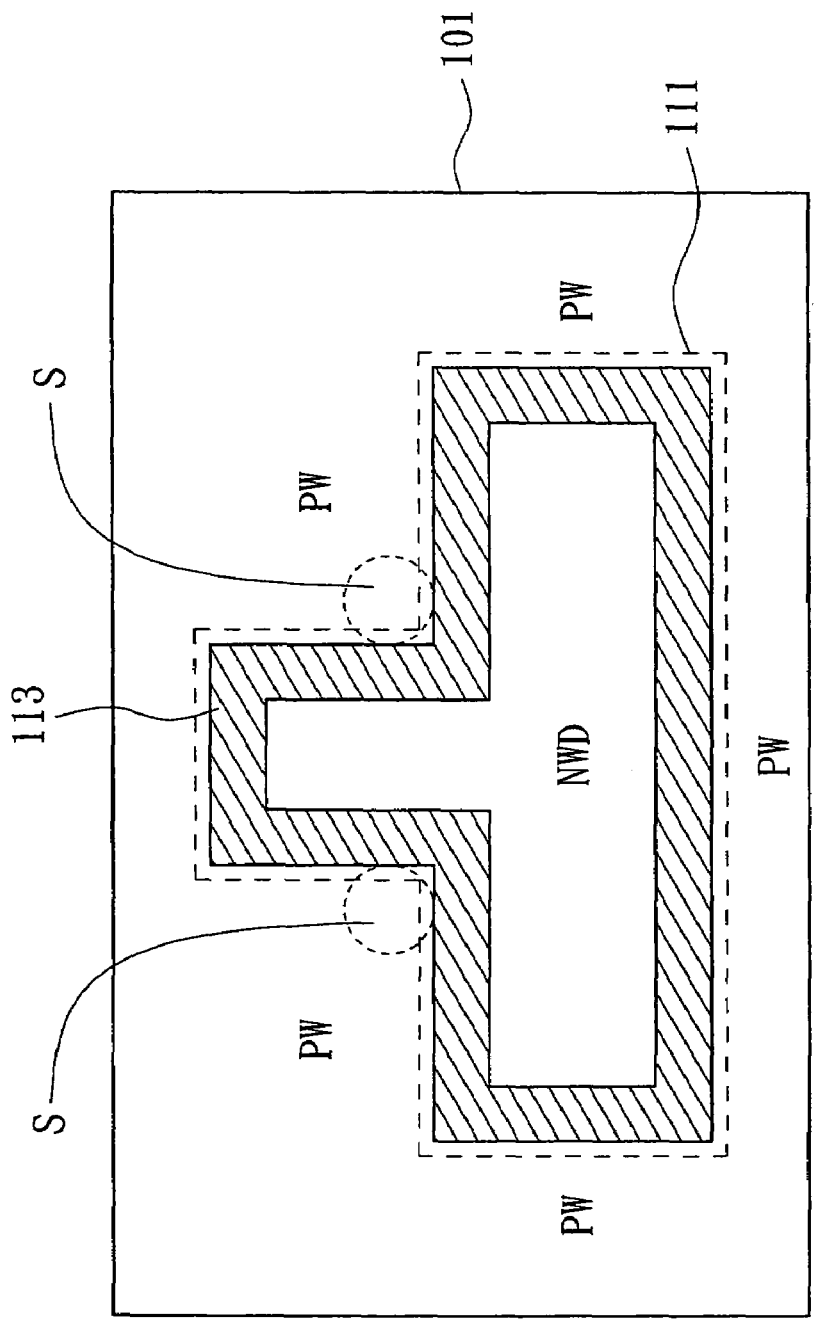
FIG. 1A (Prior Art) is a schematic top view of a concave-shaped capacitor structure formed on a HV junction.
Figure 1B:
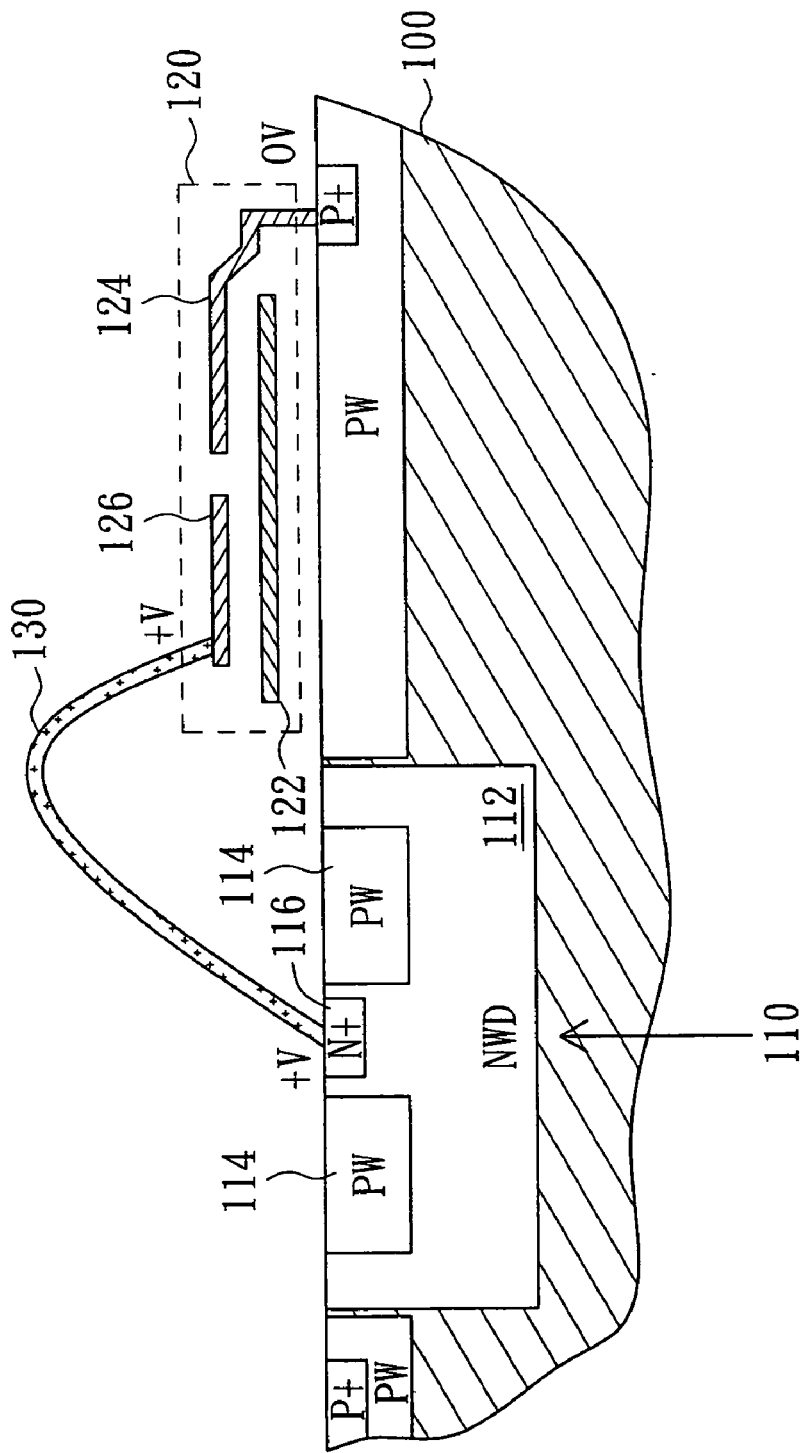
FIG. 1B (Prior Art) is a partial cross-sectional diagram of a semiconductor structure of a high side driver in a conventional power supply IC.
Figure 2A:
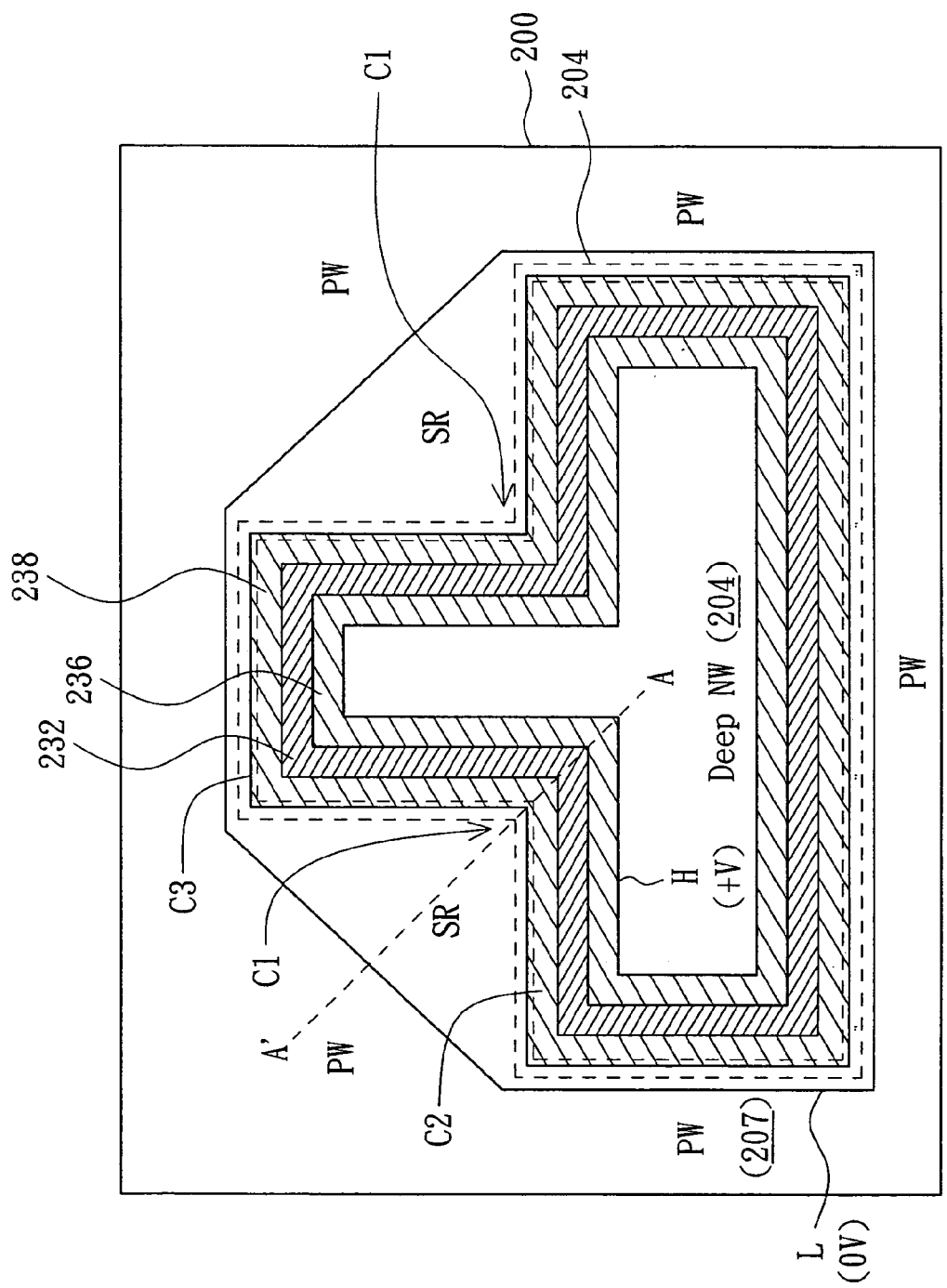
FIG. 2A is a top view of a semiconductor structure of a high side driver in a power supply IC according to a preferred embodiment of the invention.
Figure 2B:
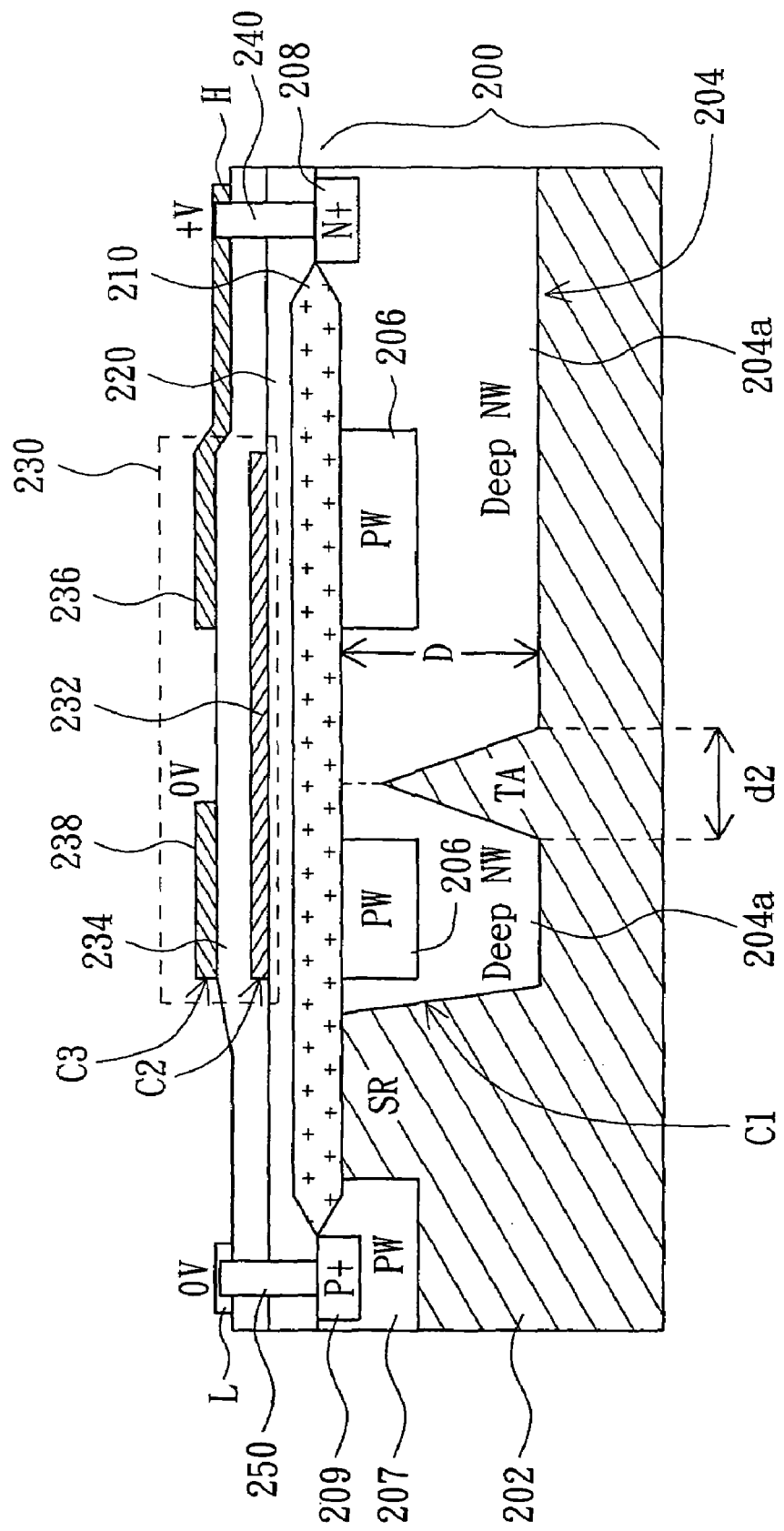
FIG. 2B is a partial cross-sectional view of a semiconductor structure of a high side driver in a power supply IC along a line A-A' according embodiment of the invention.

Referring to FIG. 2A and FIG. 2B, a top view and a partial cross-sectional view (along a line A-A') of a semiconductor structure of a high side driver in a power supply IC according to a preferred embodiment of the invention are shown. The semiconductor structure of a high side driver includes an ion-doped junction (HV junction) 200, an oxide layer 210, a first dielectric layer 220 and a conductive capacitor structure 230 as shown in FIG. 2B. The oxide layer 210 is formed on the ion-doped junction 200, the first dielectric layer 220 is formed on the oxide layer 210, and the conductive capacitor structure 230 is formed on the first dielectric layer 220.

The ion-doped junction 200 includes a substrate 202 and a deep well 204 formed in the substrate 202. The deep well 204 has a first concave structure C1, such as an L-shaped corner structure as shown in FIG. 2A. The ion-doped junction 200 further includes a semiconductor region SR connected to the first concave structure C1 of the deep well 204 and the semiconductor region SR has substantially the same ion-doping concentration as the substrate 202. In addition, the deep well 204 includes a number of deep-well regions 204a which are separated but partially linked with each other at an area near the surface of the ion-doped junction 200. For example, the ion-doped junction 200 is the p-n junction, the substrate 202 is a P-substrate and the deep well 204 is a deep N well (NW) formed in the P-substrate.

It can be seen from FIG. 2B that the deep-well regions 204a do not connect to each other completely and an approximately-triangular area TA of the substrate 202 is formed between the deep well regions 204a. By forming the partially-linked deep-well regions 204a, the breakdown voltage of the ion-doped junction 200 can be adjusted by tuning the distance d2 between the deep-well regions 204a. Preferably, the distance d2 between the deep-well regions 204a is larger than 0 um and smaller than 20 um, the doping concentration of the deep well 204 is from $1.7E17$ $cm^{-3}$ to $8.3E18$ $cm^{-3}$, and the depth D of the deep well 204 is from 2 um to 10 um.

Furthermore, the ion-doped junction 200 includes at least a first well 206, such as a P-well or P-body, in each of the deep-well regions 204a. These first wells 206 are used to increase the breakdown voltage of the ion-doped junction 200, and the breakdown voltage of the ion-doped junction 200 is determined by the shape and relative position of the first well 206 in the deep-well region 204a. The doping concentration of the first wells 206 is preferably from $3.3E17$ $cm^{-3}$ to $1E19$ $cm^{-3}$.

The ion-doped junction 200 further includes a heavy ion-doped region 208, such as an N+ region, connected to a highest potential node H of the conductive capacitor structure 230 through a contact 240 and a heavy ion-doped region 209, such as a P+ region, connected to a lowest potential node L of the conductive capacitor structure 230 through a contact 250. The depth D of the ion-doped deep wells 204 should be adjustable in a direct proportion according to a high voltage +V (500V~700V) applied to the conductive capacitor structure 230 so as to maintain an enough breakdown voltage of the ion-doped junction 200.

As shown in FIG. 2A and FIG. 2B, the conductive capacitor structure 230 includes a first metal layer 232, a second dielectric layer 234 and two second metal layers 236 and 238. The first metal layer 232 is formed on the first dielectric layer 220 and has a second concave structure C2 corresponding to the first concave structure C1. The second dielectric layer 234 is formed on the first metal layer 232. The second metal layers 236 and 238 are separated and formed on the second dielectric layer 234. Each of the second metal layers 236 and 238 has a third concave structure C3 corresponding to the second concave structure C2.

The second metal layer 236 and the first metal layer 232 form a first capacitor. The second metal layer 238 and the first metal layer 232 form a second capacitor, which is connected to the first capacitor in series. The second metal layer 236 is connected to the high voltage +V and the second metal layer 238 is connected to a low voltage, such as 0V. The breakdown voltage of the ion-doped junction 200 is also determined by the position of the first metal layer 232 relative to the ion-doped junction 200 or the thickness of the first dielectric layer 220.

Besides, the ion-doped junction 200 further includes a second well 207, such as a P well (PW), surrounding the semiconductor region SR and the deep well 204. By forming the semiconductor region SR of the ion-doped junction 200 at the first concave structure C1 of the deep well 204, that is, near the second concave structure C2 and third concave structure C3 of the conductive capacitor structure 230, the breakdown voltage of the ion-doped junction 200 near the concave structure C1 will not be seriously reduced.

Figure 3:
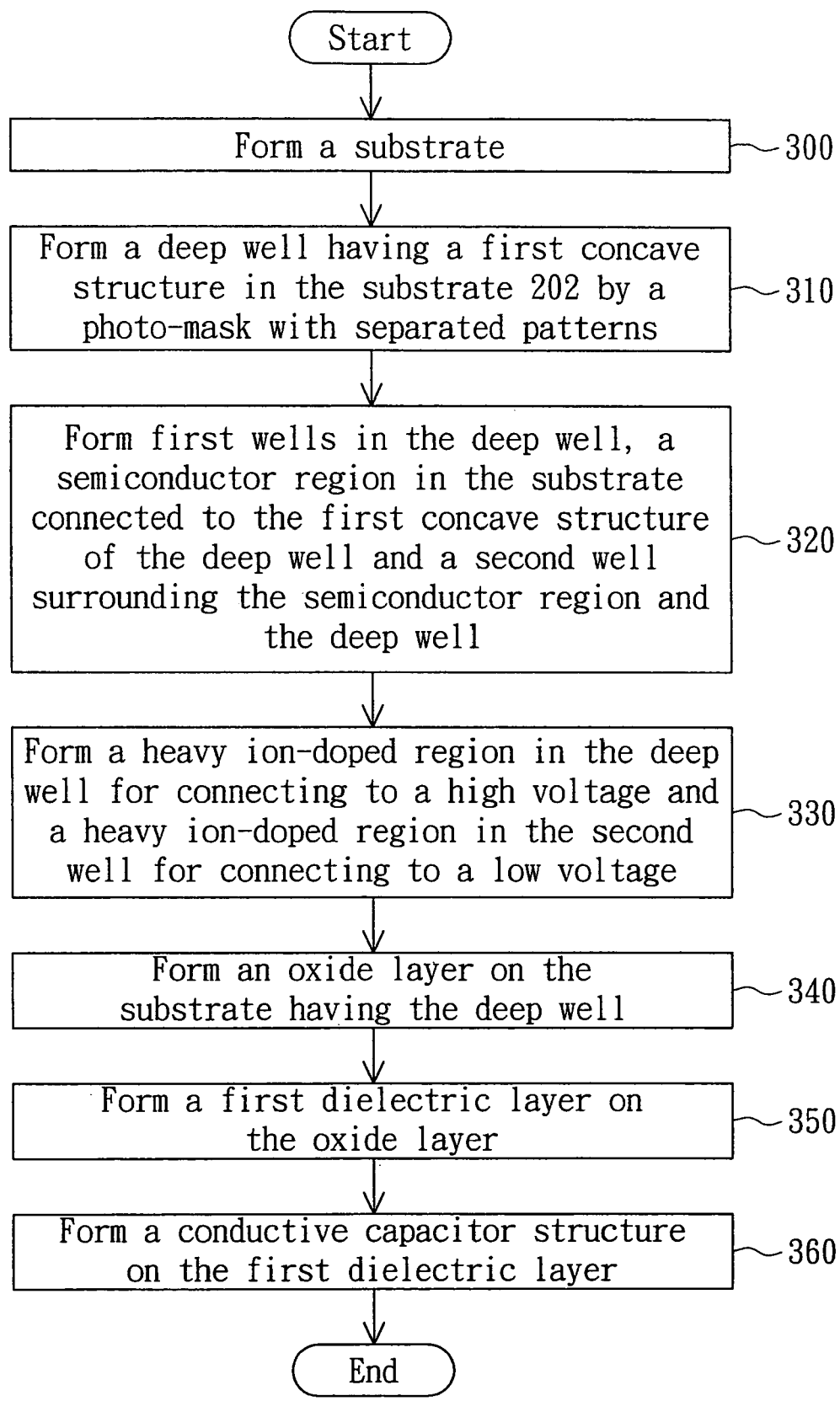
FIG. 3 is a flow chart of a method for manufacturing the semiconductor structure of a high side driver in FIG. 2B.
Figure 4:
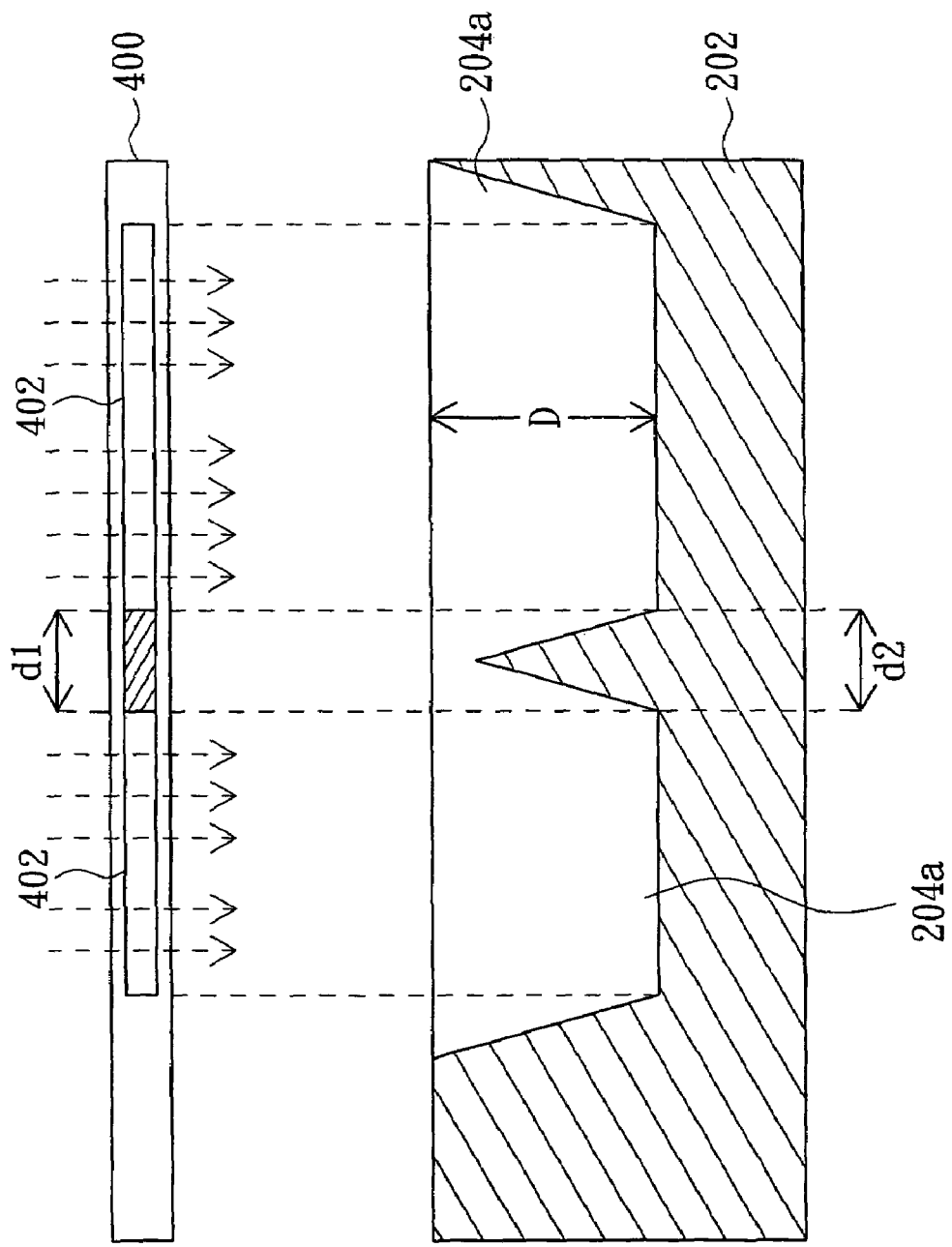
FIG. 4 is a schematic diagram of an ion doping process for forming the partially linked deep-well regions in FIG. 2B by using a photo-mask with separated patterns.

FIG. 3 is a flow chart of a method for manufacturing the semiconductor structure of a high side driver in FIG. 2B. Referring to FIG. 2B and FIG. 3 simultaneously, first, in step 300, form the substrate 202, such as a P-substrate. Next, in step 310, form the deep well 204 (such as a deep N well) having the first concave structure C1 in the substrate 202 by a photo-mask 400 with separated patterns 402 as shown in FIG. 4 in a thermal drive-in process during a temperature from 1000° C. to 1200° C. for 6~12 hours. Owing that the patterns 402 of the photo-mask 400 are separated by a predetermined distance d1, the deep well 204 is formed to have the deep-well regions 204a which are separated but partially linked with each other at an area near the upper surface of the substrate 202. The distance d1 of the separated patterns 402 is proportional to the distance d2 between the deep-well regions 204a. Preferably, the distance d2 between the deep-well regions 204a is larger than 0 um and smaller than 20 um, the doping concentration of the deep well 204 is from $1.7E17$ $cm^{-3}$ to $8.3E18$ $cm^{-3}$, and the depth D of deep well 204 is from 2 um to 10 um.

The first feature of the high side driver in the embodiment lies in the partially separated deep-well regions 204a help to increase the breakdown voltage of the substrate 202 and deep well 204 and thus the capacitor structure formed on the substrate 202 in the subsequent process will not affect or worsen the breakdown voltage of the substrate 202 and deep well 204.

Figure 5:
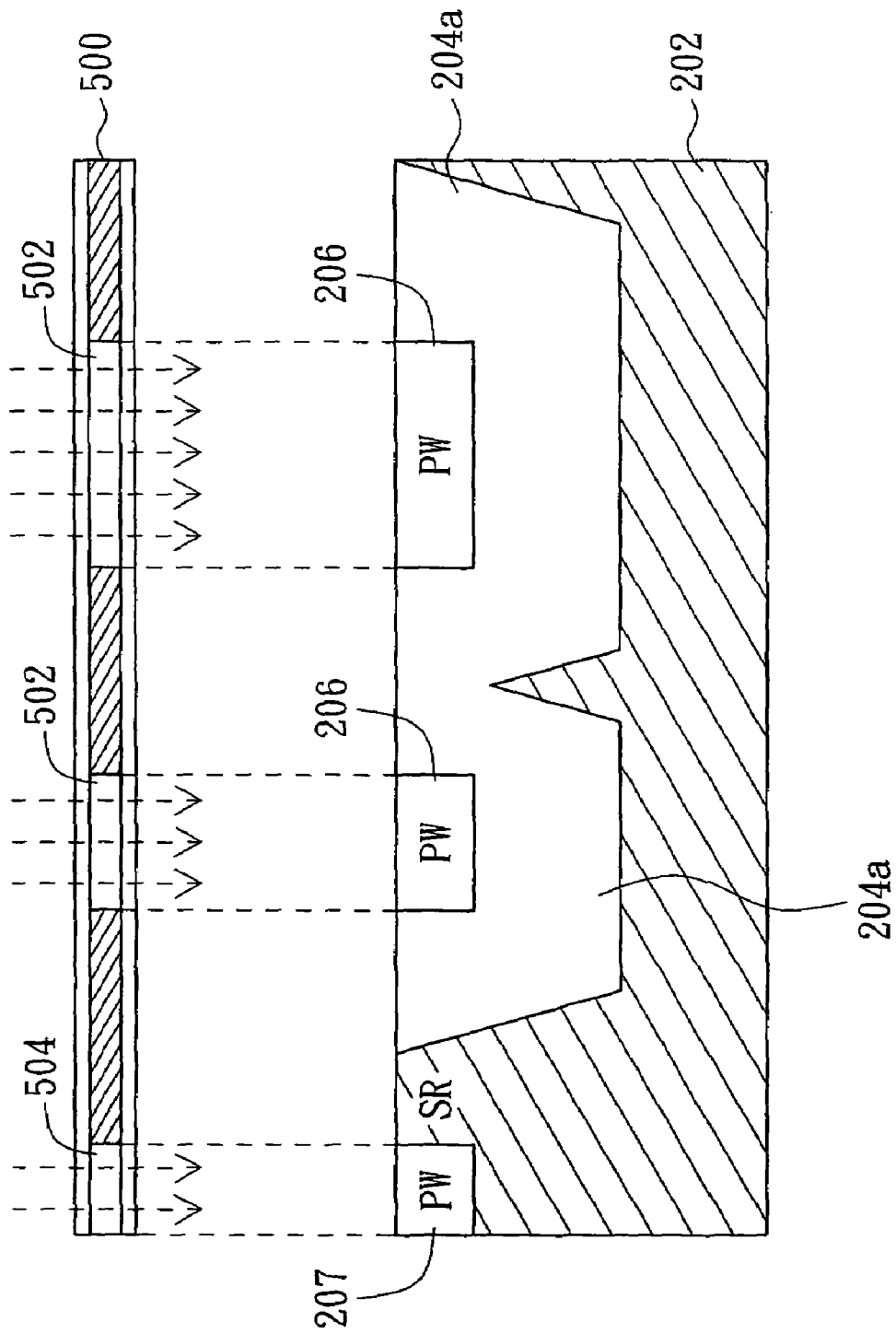
FIG. 5 is a schematic diagram of an ion doping process for forming the first wells, second well and semiconductor region near the first concave structure in FIG. 2B by using a photo-mask.

Following that, in step 320, form the first well 206 in each of the deep-well regions 204a, the semiconductor region SR in the substrate 202 connected to the first concave structure C1 of the deep well 204 and the second well 207 surrounding the semiconductor region SR and the deep well 204 by a photo-mask 500 as shown in FIG. 5 in a thermal drive-in process during a temperature 900° C. to 1100° C. for 2~6 hours. The photo-mask 500 includes separated patterns 502 and 504. The light passing through the two patterns 502 to reach the deep-well regions 204a forms the two first wells 206 and the light passing through the pattern 504 to reach the substrate 202 forms the second well 207. In the meanwhile, no light passes the photo-mask 500 and reaches the region between the second well 207 and the deep-well region 204a, which in turn forms the semiconductor region SR with doping concentration substantially the same as the substrate 202. The first wells 206 also help to increase the breakdown voltage of the substrate 202 and deep well 204, and the doping concentration of the first well 206 is preferably from $3.3E17$ $cm^{-3}$ to $1E19$ $cm^{-3}$.

The second feature of the high side driver in the embodiment lies in the semiconductor region SR having doping concentration substantially the same as the substrate 202 is formed at the first concave structure C1 of the deep well 204 in the ion-doped junction 200. By doing this, the breakdown voltage of the ion-doped junction 200 near the concave structure C1 will not be seriously worsened.

Afterward, in step 330, form the heavy ion-doped region 208, such as a N+ region, in one deep-well region 204a for connecting to the high voltage +V and the highest potential node H of the conductive capacitor structure 230, and the heavy ion-doped region 209, such as a P+ region, in the second well 207 for connecting to the low voltage 0V and the lowest potential node L of the conductive capacitor structure 230.

Then, in step 340, form the oxide layer 210 on the substrate 202 having the deep well 204 (i.e. the ion-doped junction 200), and in step 350, form the first dielectric layer 220 on the oxide layer 210. Finally, in step 360, form the conductive capacitor structure 230 on the first dielectric layer 220. The step 360 includes forming the first metal layer 232 having the second concave structure C2 on the first dielectric layer 220, forming the second dielectric layer 234 on the first metal layer 232, and forming the two separated second metal layers 236 and 238 each having the third concave structure C3 on the second dielectric layer 234. The highest potential node H and the lowest potential node L of the conductive capacitor structure 230 are respectively connected to the heavy ion-doped regions 208 and 209 through contacts 240 and 250.

Figure 6:
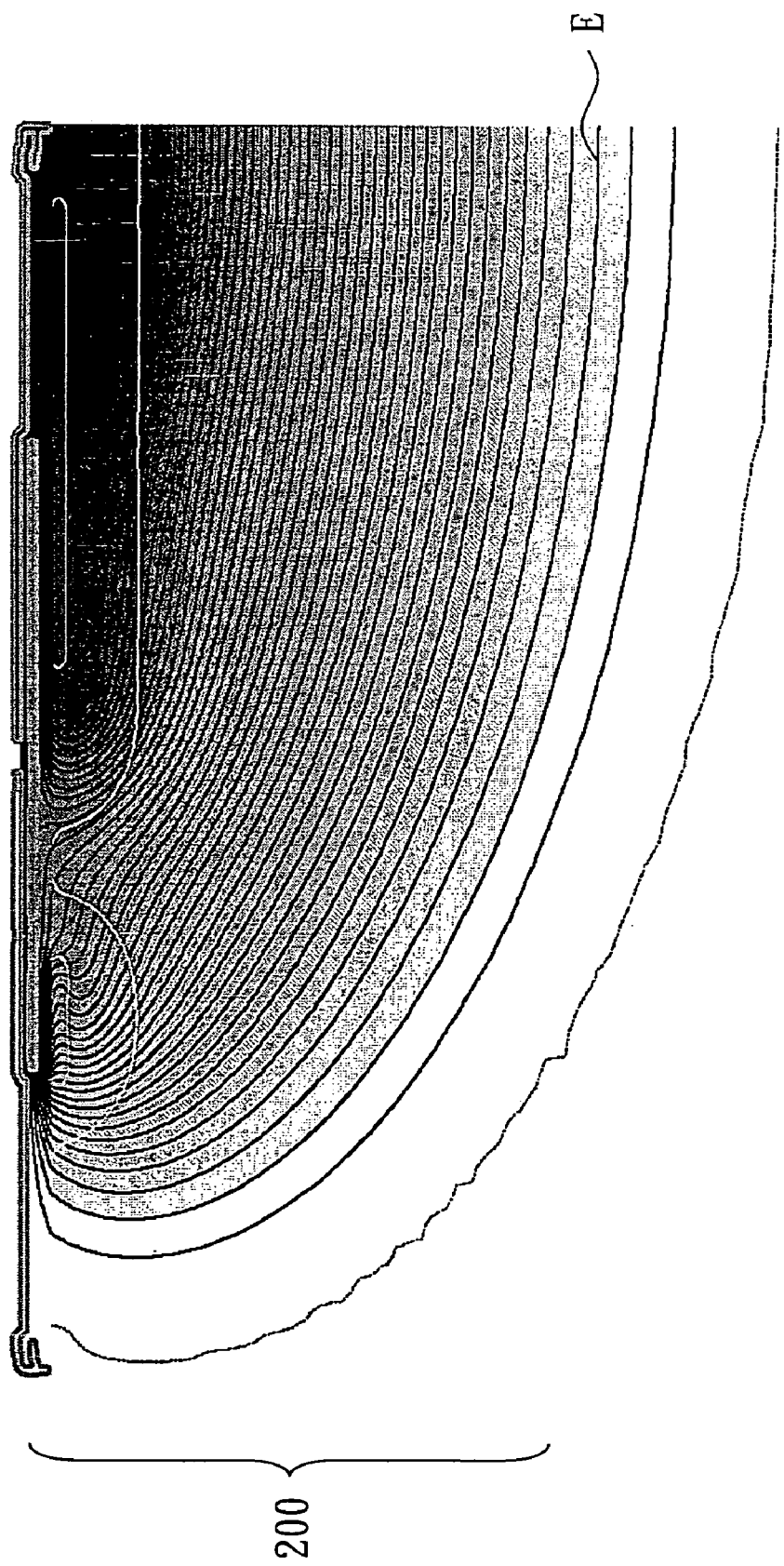
FIG. 6 is a simulation potential profile of the semiconductor structure of a high side driver according to the preferred embodiment of the invention.

Referring to FIG. 6, a simulation potential profile of the semiconductor structure of a high side driver according to the preferred embodiment of the invention is shown. From FIG. 6, it can be clearly seen that the electric field E inside the ion-doped junction 200 is very uniform, which demonstrates that a good performance of the high side driver having a concave-shaped capacitor structure integrated with the ion-doped junction 200 can still be achieved by using the ion-doped junction 200 with the partially separated deep-well regions (not shown in the figure).

The semiconductor structure of a high side driver and method for manufacturing the same disclosed by the above-mentioned embodiment have the following advantages:

1. The chip area for disposing the semiconductor structure of a high side driver can be reduced by integrating the conductive capacitor structure with the HV junction.

2. The prior-art bonding metal for connecting the capacitor structure and HV junction is not necessary in the invention since the capacitor structure can be integrated with the HV junction, thereby largely reducing cost for manufacturing the high side driver.

3. The breakdown voltage of the HV junction, especially in the region near the concave region of the capacitor structure integrated with the HV junction will not be affected by the capacitor structure and a good performance of the high side driver can be achieved.

While the invention has been described by ways of examples and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure of a high side driver, comprising:
   an ion-doped junction, comprising:
      a substrate;
      a deep well, formed in the substrate, wherein the deep well has a first concave structure;
      a semiconductor region, located on an upper surface of the substrate and connected to the first concave structure of the deep well, wherein the semiconductor region has substantially the same ion-doping concentration as the substrate; and
      a second well, surrounding the semiconductor region and the deep well, wherein the second well has a complementary ion-doped type to the deep well; and
   a conductive capacitor structure, formed above the deep well and covering the deep well.

2. The semiconductor structure according to claim 1, further comprising an oxide layer, formed on the ion-doped junction, wherein the conductive capacitor structure is formed on the oxide layer.

3. The semiconductor structure according to claim 2, wherein the ion-doped junction further comprises a heavy ion-doped region having the same ion-doped type with the deep well, and the heavy ion-doped region is connected to a highest potential node of the conductive capacitor structure.

4. The semiconductor structure according to claim 2, wherein the depth of the deep well is from 2 um to 10 um.

5. The semiconductor structure according to claim 2, further comprising a first dielectric layer formed between the conductive capacitor structure and the oxide layer.

6. The semiconductor structure according to claim 5, wherein the conductive capacitor structure comprising:
   a first metal layer, formed on the first dielectric layer, wherein the first metal layer has a second concave structure corresponding to the first concave structure;
   a second dielectric layer, formed on the first metal layer; and
   a plurality of separated second metal layers, formed on the second dielectric layer, wherein one of the second metal layers is connected to a high voltage, another one of the second metal layers is connected to a low voltage and each of the second metal layers has a third concave structure corresponding to the second concave structure.

7. The semiconductor structure according to claim 1, wherein the first concave structure is an L-shaped corner structure.

8. The semiconductor structure according to claim 1, wherein the substrate is a P-substrate and the deep well is a deep N well.

9. The semiconductor structure according to claim 1, wherein the doping concentration of the deep well is from 1.7E17 cm-3 to 8.3E18 cm-3.

10. A semiconductor structure of a high side driver, comprising:
   an ion-doped junction, comprising:
      a substrate;
      a deep well, formed in the substrate, wherein the deep well has a concave corner indented toward a central part of the deep well;
      a semiconductor region, located on an upper surface of the substrate and connected to the concave corner of the deep well, wherein the semiconductor region has substantially the same ion-doping concentration as the substrate; and
      a second well, surrounding the semiconductor region and the deep well, wherein the second well has a complementary ion-doped type to the deep well.

* * * * *